US012305283B2

(12) United States Patent
AuBuchon et al.

(10) Patent No.: US 12,305,283 B2
(45) Date of Patent: May 20, 2025

(54) DITHERING OR DYNAMIC OFFSETS FOR IMPROVED UNIFORMITY

(71) Applicant: Applied Materials, Inc., Santa Clara, CA (US)

(72) Inventors: Joseph AuBuchon, San Jose, CA (US); Sanjeev Baluja, Campbell, CA (US); Michael Rice, Pleasanton, CA (US); Arkaprava Dan, San Jose, CA (US); Hanhong Chen, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/761,994

(22) Filed: Jul. 2, 2024

(65) Prior Publication Data
US 2024/0352586 A1 Oct. 24, 2024

Related U.S. Application Data

(62) Division of application No. 17/025,025, filed on Sep. 18, 2020, now Pat. No. 12,077,861.

(60) Provisional application No. 62/902,891, filed on Sep. 19, 2019.

(51) Int. Cl.
C23C 16/458 (2006.01)
C23C 16/455 (2006.01)
C23C 16/52 (2006.01)

(52) U.S. Cl.
CPC .... *C23C 16/4584* (2013.01); *C23C 16/45544* (2013.01); *C23C 16/52* (2013.01)

(58) Field of Classification Search
CPC .................. C23C 14/54; B05D 1/40
See application file for complete search history.

(56) References Cited

U.S. PATENT DOCUMENTS

| 10,109,517 | B1 | 10/2018 | Blank et al. |
| 2003/0035705 | A1 | 2/2003 | Johnson |
| 2008/0170932 | A1 | 7/2008 | Yamamoto |
| 2019/0131167 | A1 | 5/2019 | Rice et al. |

FOREIGN PATENT DOCUMENTS

| JP | 2009059808 A | 3/2009 |
| TW | 201730943 A | 9/2017 |
| WO | 2006023326 A1 | 3/2006 |
| WO | 2018226198 A1 | 12/2018 |
| WO | 2019112747 A1 | 6/2019 |

OTHER PUBLICATIONS

"PCT International Search Report and Written Opinion in PCT/US2020/051510 dated Dec. 23, 2020, 9 pages".

*Primary Examiner* — Ronald P Jarrett
(74) *Attorney, Agent, or Firm* — SERVILLA WHITNEY LLC

(57) ABSTRACT

Apparatus and methods to process one or more substrates are described. A plurality of process stations are arranged in a circular configuration around a rotational axis. A support assembly with a rotatable center base defining a rotational axis, at least two support arms extending from the center base and heaters on each of the support arms is positioned adjacent the processing stations so that the heaters can be moved amongst the various process stations to perform one or more process condition. The support assembly configured to offset the position of the substrate with respect to the processing stations.

12 Claims, 13 Drawing Sheets

DITHERING OR DYNAMIC OFFSETS FOR IMPROVED UNIFORMITY

CROSS-REFERENCE TO RELATED APPLICATIONS

This application is a divisional of U.S. patent application Ser. No. 17/025,025, filed Sep. 18, 2020, which claims priority to U.S. Provisional Application No. 62/902,891, filed Sep. 19, 2019, the entire disclosures of which are hereby incorporated by reference herein.

TECHNICAL FIELD

The present disclosure relates generally to apparatus for depositing thin films. In particular, the disclosure relates to apparatus employing dithering or dynamic offsets for improved uniformity in atomic layer deposition.

BACKGROUND

Current atomic layer deposition (ALD) processes have a number of potential issues and difficulties. Many ALD chemistries (e.g., precursors and reactants) are "incompatible", which means that the chemistries cannot be mixed together. If the incompatible chemistries mix, a chemical vapor deposition (CVD) process, instead of the ALD process could occur. The CVD process generally has less thickness control than the ALD process and/or can result in the creation of gas phase particles which can cause defects in the resultant device. For a traditional time-domain ALD process in which a single reactive gas is flowed into the processing chamber at a time, a long purge/pump out time occurs so that the chemistries are not mixed in the gas phase. A spatial ALD chamber can move one or more substrate(s) from one environment to a second environment faster than a time-domain ALD chamber can pump/purge, resulting in higher throughput.

Deposition in an ALD process occurs in cyclic exposure cycles in which a precursor is introduced into the chamber until all available active sites are occupied by chemisorption of the reactant. Given enough time the reaction will saturate the full surface before the precursor gas is evacuated from the chamber, after which the chamber is purged before a next gas in the cycle is introduced for subsequent layering or etching. The cyclic exposure process is slow, with layering occurring on a monolayer or sub-monolayer of precursor molecules, the film thickness being measured in Angstroms.

In some spatial ALD deposition tools, primary deposition steps occur when the substrate is stationary in a processing station. Deposition non-uniformity occurs as a result of the stationary positioning of the substrate for each reactive portion of the ALD process. Therefore, there is a need in the art for improved deposition apparatus and methods to decrease deposition non-uniformity.

SUMMARY

One or more embodiments of the disclosure are directed to processing methods. A support surface is moved from a first process position within a first processing station to a first process position within a second processing station. The support surface is moved from the first process position in the second processing station to a second process position within the first processing station, the second process position within the first processing station different from the first process position within the first processing station.

Additional embodiments of the disclosure are directed to support assemblies comprising a support surface positioned a distance from a central axis of the support assembly. The support surface is rotatable around the central axis. A controller is configured to move a center of the support surface from a first process position of a first processing station to a first process position of a second processing station, and to an angular offset position of the first process position in the first processing station.

Further embodiments of the disclosure are directed to processing chambers comprising a housing with walls, a bottom and a top defining an interior volume. A support assembly comprising a plurality of support surfaces is within the housing. The plurality of support surfaces are positioned a distance from a central axis of the support assembly. The support surfaces are rotatable around the central axis. A plurality of process stations are in the interior volume of the housing. The process stations are positioned in a circular arrangement around the central axis with each process station comprising a gas injector having a front face. A motor is connected to the support assembly and is configured to rotate the support assembly around the central axis. A controller is configured to move a center of the support surface from a first process position of a first processing station to a first process position of a second processing station, and to an angular offset position of the first process position in the first processing station.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The embodiments as described herein are illustrated by way of example and not limitation in the figures of the accompanying drawings in which like references indicate similar elements. The figures are not drawn to scale and may be simplified for clarity. Elements and features of one embodiment may be beneficially incorporated in other embodiments without further recitation

DETAILED DESCRIPTION

Figure 1:
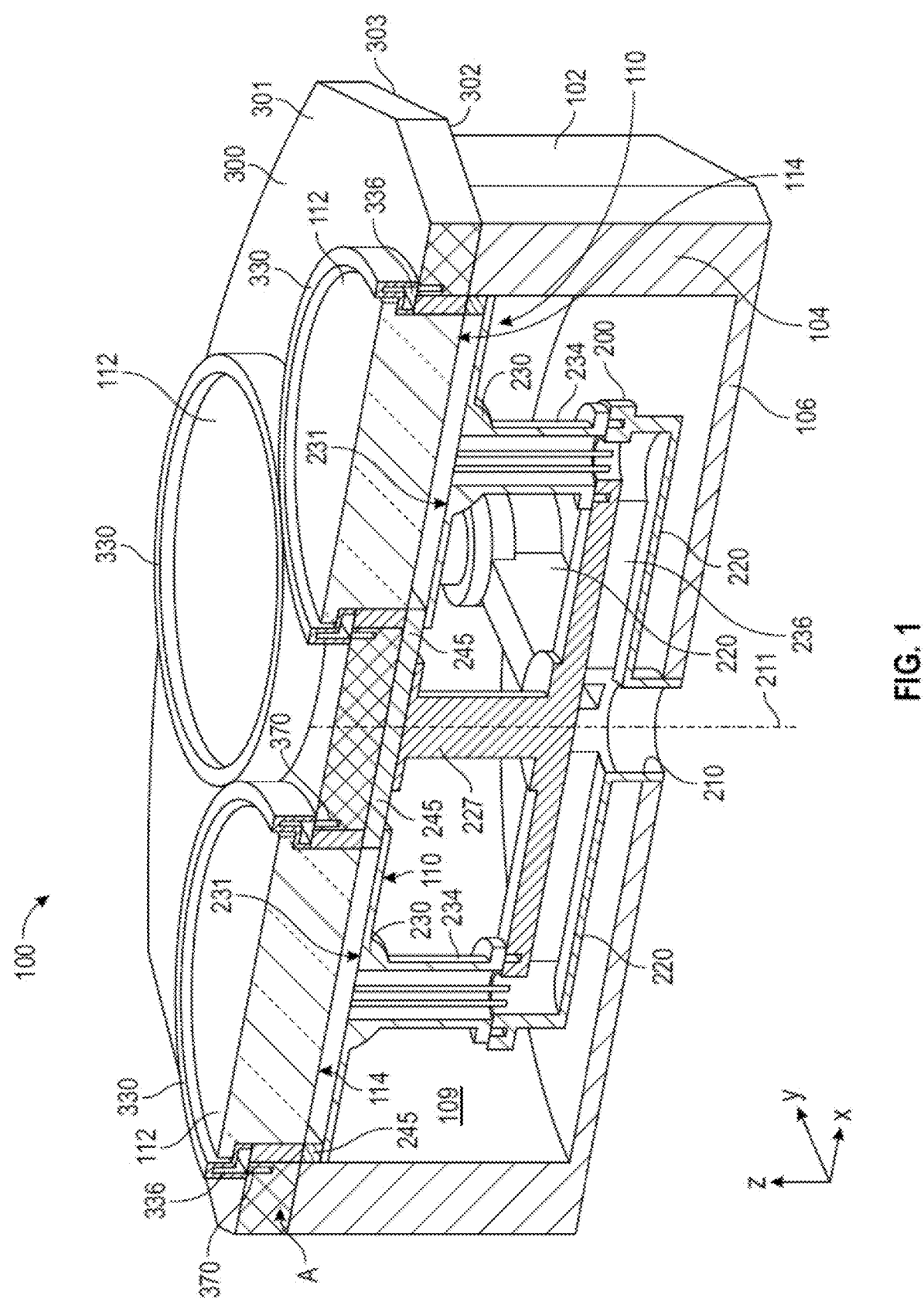
FIG. 1 shows an cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

One or more embodiments of the disclosure use spatial separation between two or more processing environments. Some embodiments advantageously provide apparatus and methods to maintain separation of incompatible gases. Some embodiments advantageously provide apparatus and methods including optimizable plasma processing. Some embodiments advantageously provide apparatus and methods that allow for a differentiated thermal dosing environment, a differentiated plasma treatment environment and other environments.

One or more embodiments of the disclosure are directed to processing chambers having four spatially separated processing environments, also referred to as processing stations. Some embodiments have more than four and some embodiments have less than four. The processing environments can be mounted coplanar to the substrate(s) that are moving in a horizontal plane. The process environments are placed in a circular arrangement. A rotatable structure with one to four (or more) individual substrate heaters mounted thereon moves the substrates in a circular path with a diameter similar to the process environments. Each heater may be temperature controlled and may have one or multiple concentric zones. For substrate loading, the rotatable structure could be lowered so that a vacuum robot could pick finished substrates and place unprocessed substrates on lift pins located above each substrate heater (in the lower Z position). In operation, each substrate can be under an independent environment until the process is finished, then rotatable structure can rotate to move the substrates on the heaters to the next environment (90° rotation for four stations, 120° rotation if three stations) for processing.

Some embodiments of the disclosure advantageously provide spatial separation for ALD with incompatible gases. Some embodiments allow for higher throughput and tool resource utilization than a traditional time-domain or spatial process chamber. Each process environment can operate at a different pressure. The heater rotation has Z direction motion so each heater can be sealed into a chamber.

Some embodiments advantageously provide plasma environments that can include one or more of microwave, ICP, parallel plate CCP or 3 electrode CCP. The entire wafer can be immersed in plasma; eliminating the plasma damage from non-uniform plasma across the wafer.

In some embodiments, a small gap between the showerhead and the substrate can be used to increase dose gas utilization and cycle time speed. Precise showerhead temperature control and high operating range (up to 230° C.). Without being bound by theory, it is believed that the closer the showerhead temperature is to the substrate temperature, the better the substrate temperature uniformity.

The showerheads can include small gas holes (<200 μm), a high number of gas holes (many thousands to greater than 10 million) and recursively fed gas distribution inside the showerhead using small distribution volume to increase speed. The small size and high number gas holes can be created by laser drilling or dry etching. When a substrate is close to the showerhead, there is turbulence experienced from the gas going through the vertical holes towards the substrate. Some embodiments allow for a slower velocity gas through the showerhead using a large number of holes spaced close together achieving a uniform distribution to the substrate surface.

Some embodiments are directed to integrated processing platforms using a plurality of spatially separated processing stations (chambers) on a single tool. The processing platform can have a variety of chambers that can perform different processes.

Some embodiments of the disclosure are directed to apparatus and methods to move substrate(s) attached to a substrate heater(s) from one environment to another environment. The rapid movement can be enabled by, for example, electrostatically chucking the substrate(s) or vacuum-chucking the substrates to the heater(s). The movement of the substrates can be in linear or circular motion.

Figure 2:
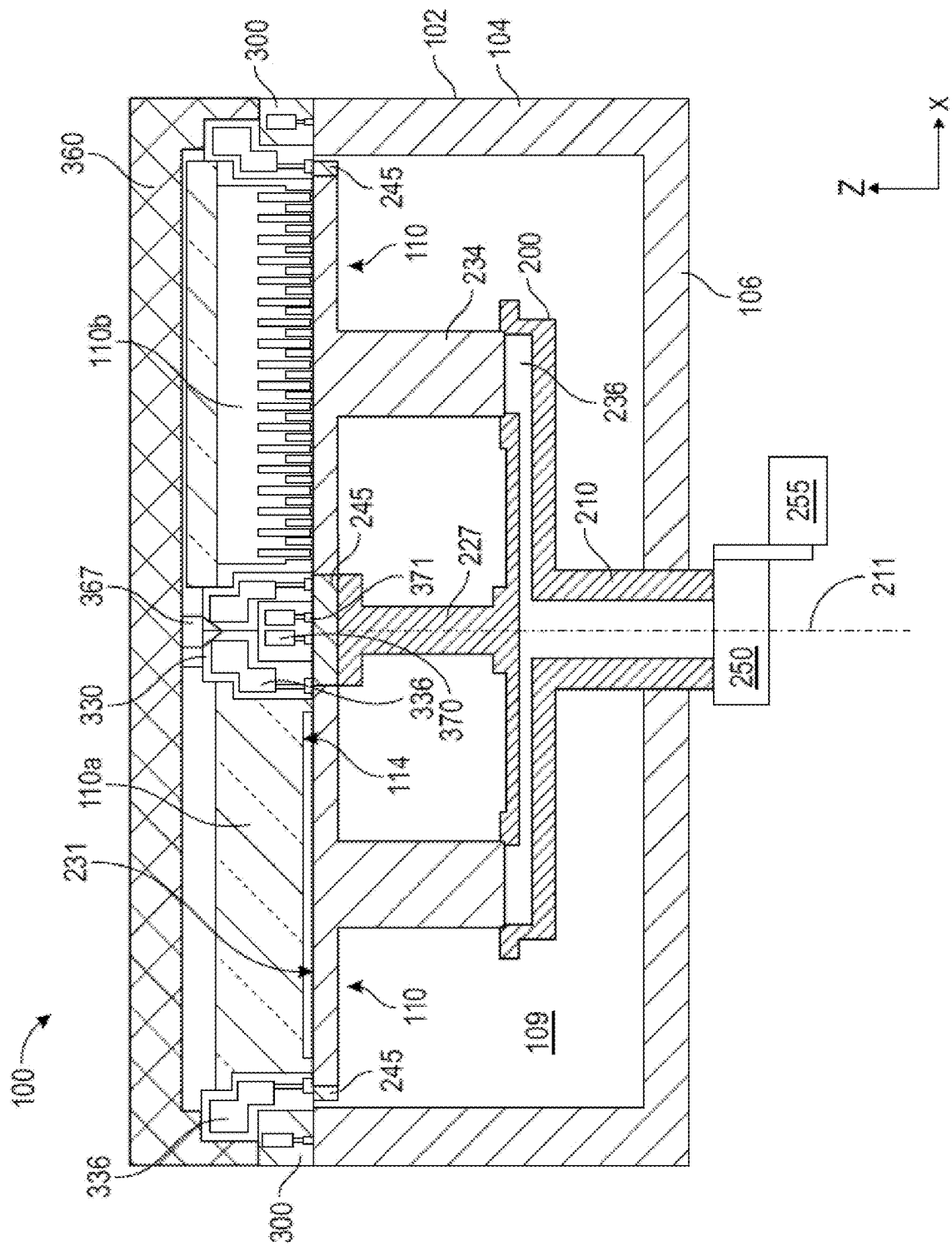
FIG. 2 shows a cross-sectional view of a processing chamber in accordance with one or more embodiment of the disclosure.
Figure 3:
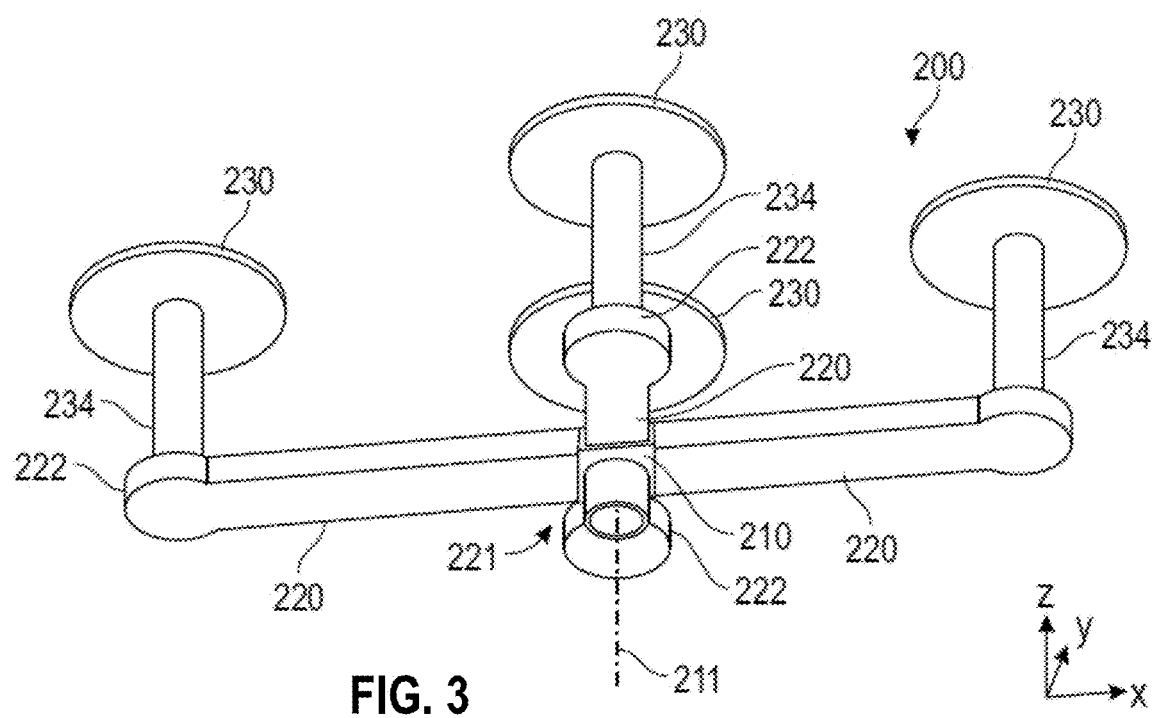
FIG. 3 shows a bottom parallel projection view of a support assembly in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view in accordance with one or more embodiments of the disclosure. FIG. 2 shows a processing chamber 100 in cross-section according to one or more embodiments of the disclosure. Accordingly, some embodiments of the disclosure are directed to processing chambers 100 that incorporate a support assembly 200 and top plate 300.

The processing chamber 100 has a housing 102 with walls 104 and a bottom 106. The housing 102 along with the top plate 300 define an interior volume 109, also referred to as a processing volume.

The processing chamber 100 includes a plurality of process stations 110. The process stations 110 are located in the interior volume 109 of the housing 102 and are positioned in a circular arrangement around the rotational axis 211 of the support assembly 200. The process stations 110 are spatially arranged around the interior volume 109 of the processing chamber 100. Each process station 110 comprises a gas injector 112 having a front face 114.

The process stations 110 can be configured to perform any suitable process and provide any suitable process conditions. The type of gas injector 112 used will depend on, for example, the type of process being performed and the type of showerhead or gas injector. For example, a process station 110 configured to operate as an atomic layer deposition apparatus may have a showerhead or vortex type gas injector. Whereas, a process station 110 configured to operate as a plasma station may have one or more electrode and/or grounded plate configuration to generate a plasma while allowing a plasma gas to flow toward the substrate. The embodiment illustrated in FIG. 2 has a different type of process station 110 on the left side (process station 110a) of the drawing than on the right side (process station 110b) of the drawing. Suitable process stations 110 include, but are not limited to, thermal processing stations, microwave plasma, three-electrode CCP, ICP, parallel plate CCP, UV exposure, laser processing, pumping chambers, annealing stations and metrology stations.

Figure 4:
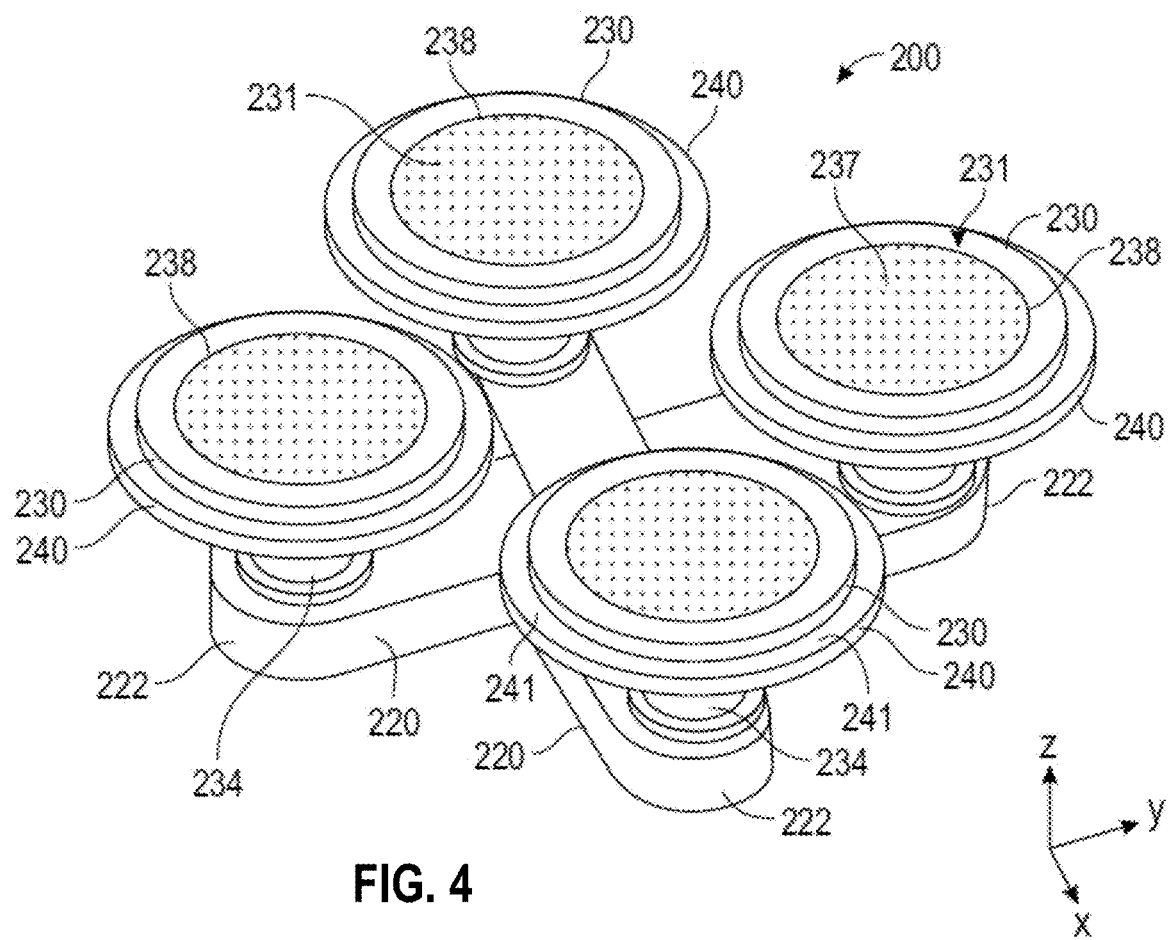
FIG. 4 shows a top parallel projection view of the support assembly in accordance with one or more embodiment of the disclosure.
Figure 5:
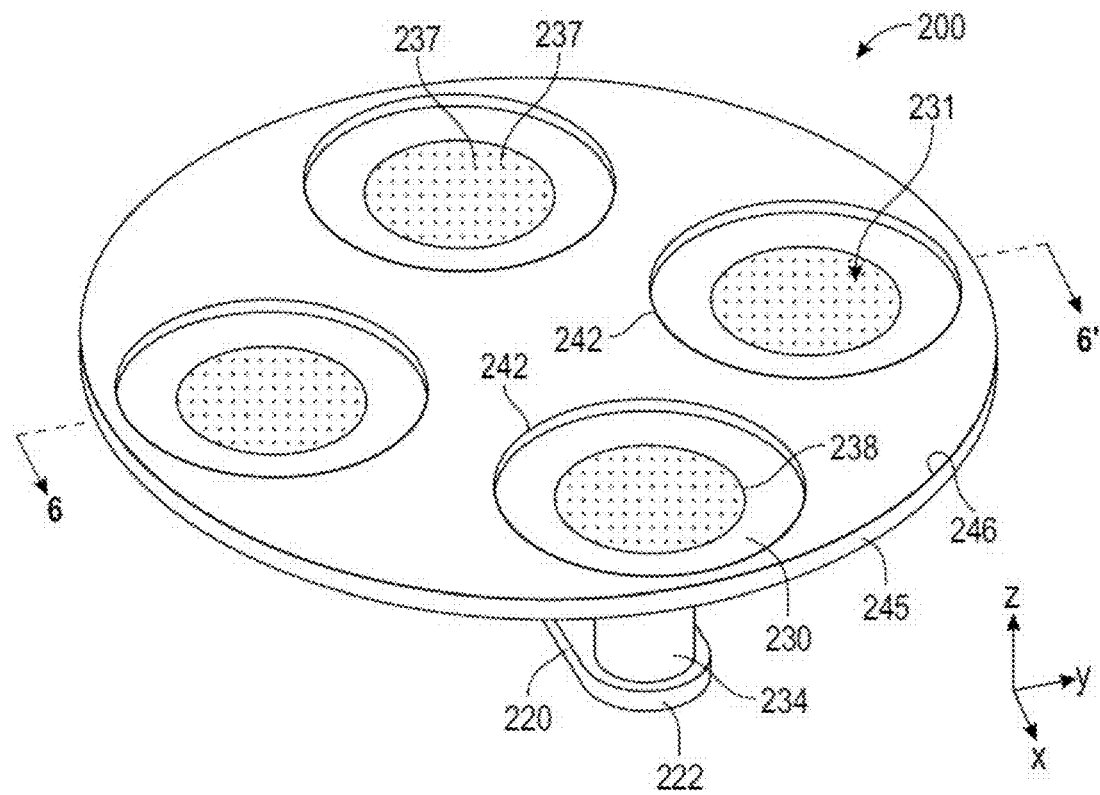
FIG. 5 shows a top parallel projection view of a support assembly in accordance with one or more embodiment of the disclosure.
Figure 6:
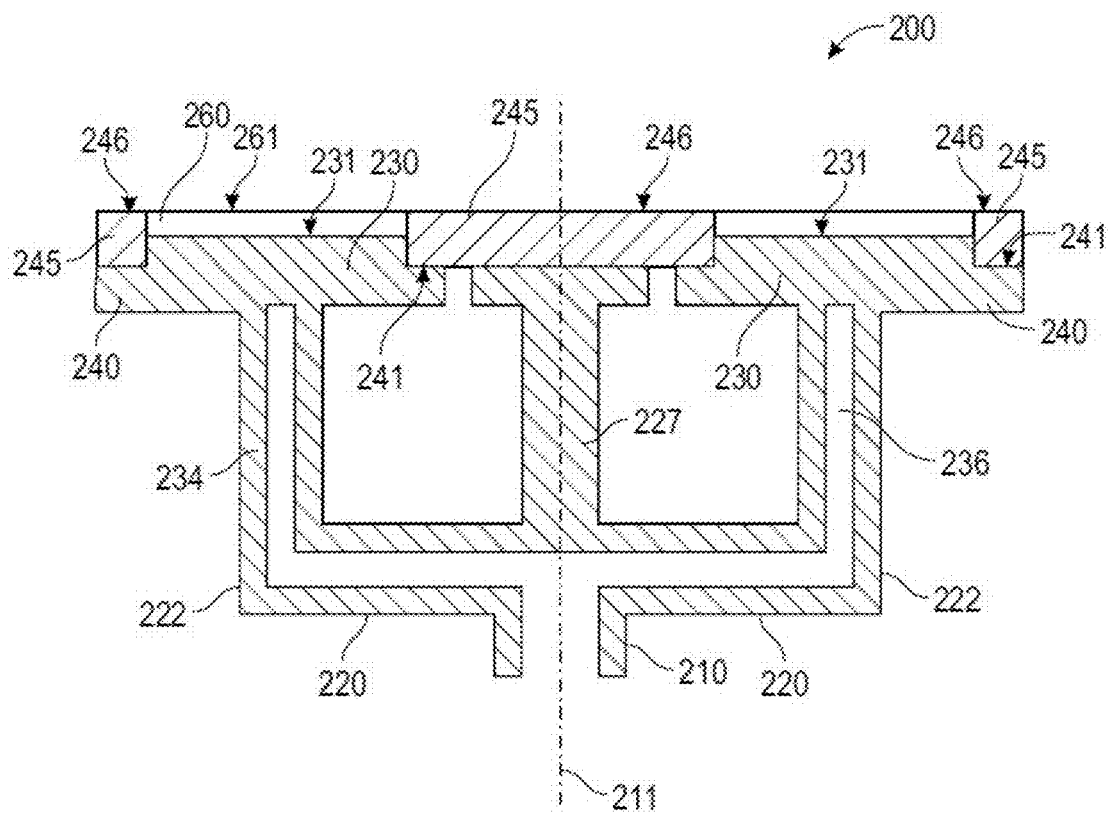
FIG. 6 shows a cross-sectional side view of a support assembly in accordance with one or more embodiment of the disclosure.

FIGS. 3 through 6 illustrate support assemblies 200 in accordance with one or more embodiments of the disclosure. The support assembly 200 includes a rotatable center base 210. The rotatable center base 210 can have a symmetrical or asymmetrical shape and defines a rotational axis 211. The rotational axis 211, as can be seen in FIG. 6, extends in a first direction. The first direction may be referred to as the vertical direction or along the z-axis; however, it will be understood that the use of the term "vertical" in this manner is not limited to a direction normal to the pull of gravity.

The support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. The support arms 220 can be connected to the center base 210 at the inner end 221 by fasteners (e.g., bolts) or by being integrally formed with the center base 210.

In some embodiments, the support arms 220 extend orthogonal to the rotational axis 211 so that one of the inner ends 221 or outer ends 222 are further from the rotational axis 211 than the other of the inner ends 221 and outer ends 222 on the same support arm 220. In some embodiments, the inner end 221 of the support arm 220 is closer to the rotational axis 211 than the outer end 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotation axis 211. In some embodiments, the support assembly 200 has n-number of support arms 220 and the n-number of support arms 220 are arranged to provide n-fold symmetry around the rotation axis 211.

A heater 230 is positioned at the outer end 222 of the support arms 220. In some embodiments, each support arm 220 has a heater 230. The center of the heaters 230 are located at a distance from the rotational axis 211 so that upon rotation of the center base 210 the heaters 230 move in a circular path.

The heaters 230 have a support surface 231 which can support a substrate. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230.

In some embodiments, a channel 236 is formed in one or more of the center base 210, the support arms 220 and/or the heater standoffs 234. The channel 236 can be used to route electrical connections or to provide a gas flow.

The heaters can be any suitable type of heater known to the skilled artisan. In some embodiments, the heater is a resistive heater with one or more heating elements within a heater body.

Figure 7:
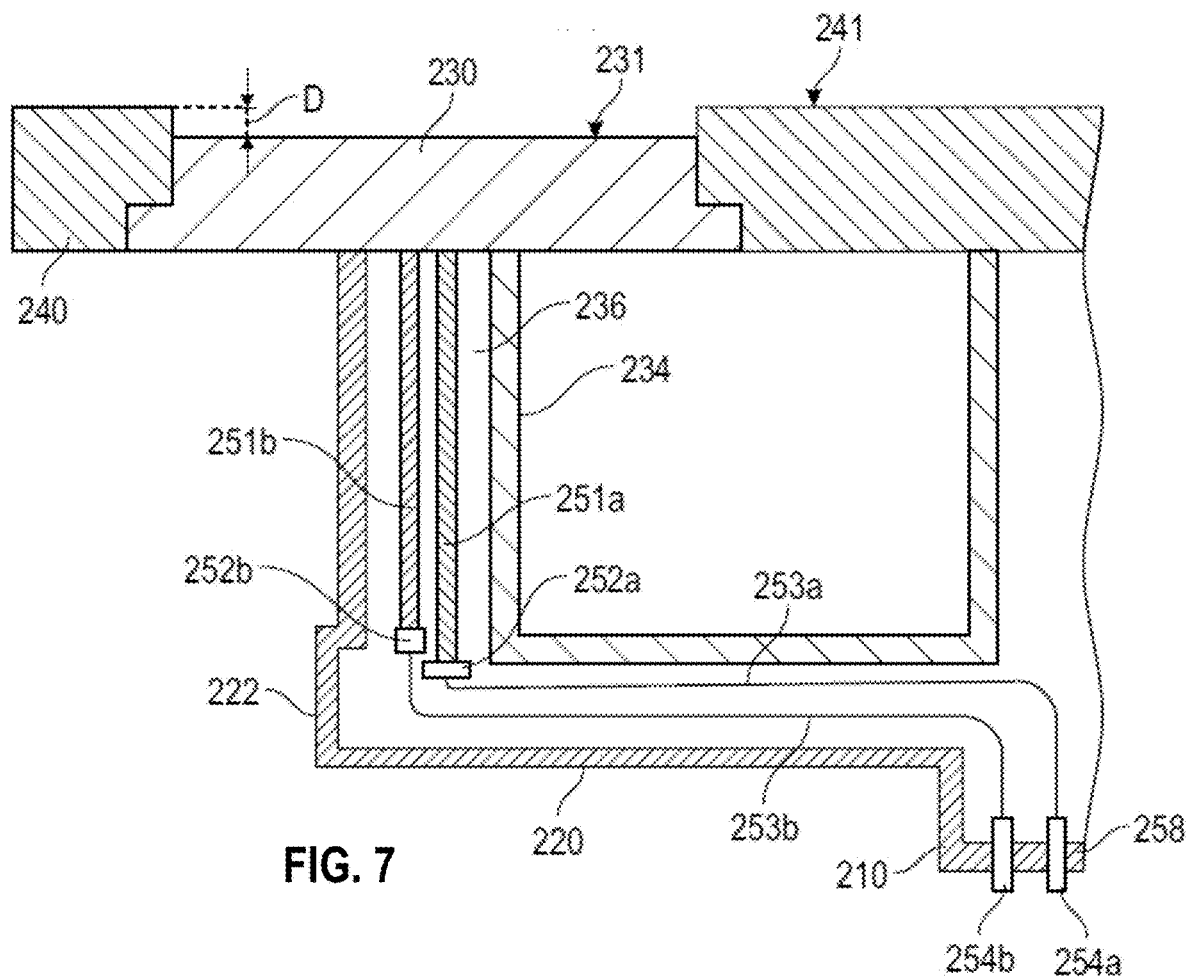
FIG. 7 shows a partial cross-sectional side view of a support assembly in accordance with one or more embodiment of the disclosure.

The heaters 230 of some embodiments include additional components. For example, the heaters may comprise an electrostatic chuck. The electrostatic chuck can include various wires and electrodes so that a substrate positioned on the heater support surface 231 can be held in place while the heater is moved. This allows a substrate to be chucked onto a heater at the beginning of a process and remain in that same position on that same heater while moving to different process regions. In some embodiments, the wires and electrodes are routed through the channels 236 in the support arms 220. FIG. 7 shows an expanded view of a portion of a support assembly 200 in which the channel 236 is shown. The channel 236 extends along the support arm 220 and the heater standoff 234. A first electrode 251a and second electrode 251b are in electrical communication with heater 230, or with a component inside heater 230 (e.g., a resistive wire). First wire 253a connects to first electrode 251a at first connector 252a. Second wire 253b connects to second electrode 251b at second connector 252b.

In some embodiments, a temperature measuring device (e.g., pyrometer, thermistor, thermocouple) is positioned within the channel 236 to measure one or more of the heater 230 temperature or the temperature of a substrate on the heater 230. In some embodiments, the control and/or measurement wires for the temperature measurement device are routed through the channel 236. In some embodiments, one or more temperature measurement devices are positioned within the processing chamber 100 to measure the temperature of the heaters 230 and/or a substrate on the heaters 230. Suitable temperature measurement devices are known to the skilled artisan and include, but are not limited to, optical pyrometers and contact thermocouples.

The wires can be routed through the support arms 220 and the support assembly 200 to connect with a power source (not shown). In some embodiments, the connection to the power source allows continuous rotation of the support assembly 200 without tangling or breaking the wires 253a, 253b. In some embodiments, as shown in FIG. 7, the first wire 253a and second wire 253b extend along the channel 236 of the support arm 220 to the center base 210. In the center base 210 the first wire 253a connects with center first connector 254a and the second wire 253b connects with center second connector 254b. The center connectors 254a, 254b can be part of a connection plate 258 so that power or electronic signals can pass through center connectors 254a, 254b. In the illustrated embodiment, the support assembly 200 can rotate continuously without twisting or breaking wires because the wires terminate in the center base 210. A second connection is on the opposite side of the connection plate 258 (outside of the processing chamber).

In some embodiments, the wires are connected directly to a power source or electrical component outside of the processing chamber through the channel 236. In embodiments of this sort, the wires have sufficient slack to allow the support assembly 200 to be rotated a limited amount without twisting or breaking the wires. In some embodiments, the support assembly 200 is rotated less than or equal to about 1080°, 990°, 720°, 630°, 360° or 270° before the direction of rotation is reversed. This allows the heaters to be rotated through each of the stations without breaking the wires.

Referring again to FIGS. 3 through 6, the heater 230 and support surface 231 can include one or more gas outlets to provide a flow of backside gas. This may assist in the removal of the substrate from the support surface 231. As shown in FIGS. 4 and 5, the support surface 231 includes a plurality of openings 237 and a gas channel 238. The openings 237 and/or gas channel 238 can be in fluid communication with one or more of a vacuum source or a gas source (e.g., a purge gas). In embodiments of this sort, a hollow tube can be included to allow fluid communication of a gas source with the openings 237 and/or gas channel 238.

In some embodiments, the heater 230 and/or support surface 231 are configured as an electrostatic chuck. In embodiments of this sort, the electrodes 251a, 251b (see FIG. 7) can include control lines for the electrostatic chuck.

Some embodiments of the support assembly 200 include a sealing platform 240. The sealing platform has a top surface 241, a bottom surface and a thickness. The sealing platform 240 can be positioned around the heaters 230 to help provide a seal or barrier to minimize gas flowing to a region below the support assembly 200.

In some embodiments, as shown in FIG. 4, the sealing platforms 240 are ring shaped and are positioned around each heater 230. In the illustrated embodiment, the sealing platforms 240 are located below the heater 230 so that the top surface 241 of the sealing platform 240 is below the support surface 231 of the heater.

Figure 8:
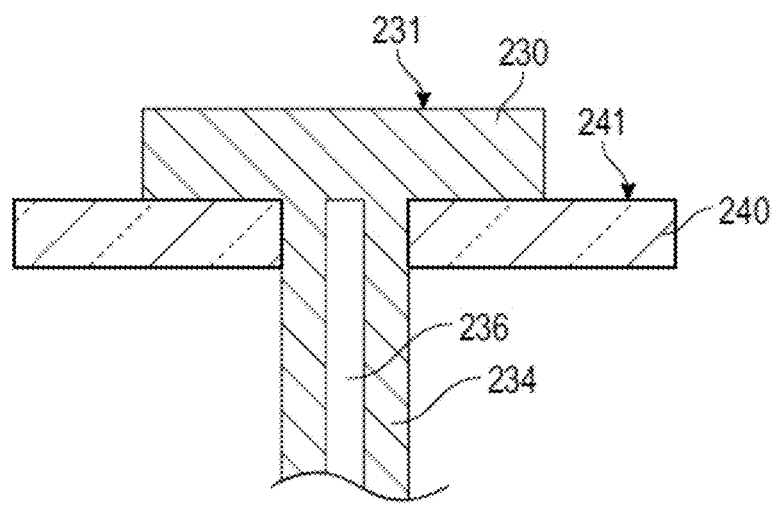
FIG. 8 shows a partial cross-sectional side view of a support assembly in accordance with one or more embodiment of the disclosure.

The sealing platforms 240 can have a number of purposes. For example, the sealing platforms 240 can be used to increase the temperature uniformity of the heater 230 by increasing thermal mass. In some embodiments, the sealing platforms 240 are integrally formed with the heater 230 (see for example FIG. 6). In some embodiments, the sealing platforms 240 are separate from the heater 230. For example, the embodiment illustrated in FIG. 8 has the sealing platform 240 as a separate component connected to the heater standoff 234 so that the top surface 241 of the sealing platform 240 is below the level of the support surface 231 of the heater 230.

The sealing platforms 240 can have a number of purposes. For example, the sealing platforms 240 can be used to increase the temperature uniformity of the heater 230 by increasing thermal mass. In some embodiments, the sealing platforms 240 are integrally formed with the heater 230 (see for example FIG. 6). In some embodiments, the sealing platforms 240 are separate from the heater 230. For example, the embodiment illustrated in FIG. 8 has the sealing platform 240 as a separate component connected to the heater standoff 234 so that the top surface 241 of the sealing platform 240 is below the level of the support surface 231 of the heater 230.

In some embodiments, the sealing platforms 240 act as a holder for a support plate 245. In some embodiments, as shown in FIG. 5, the support plate 245 is a single component that surrounds all of the heaters 230 with a plurality of openings 242 to allow access to the support surface 231 of the heaters 230. The openings 242 can allow the heaters 230 to pass through the support plate 245. In some embodiments, the support plate 245 is fixed so that the support plate 245 moves vertically and rotates with the heaters 230.

Figure 9:
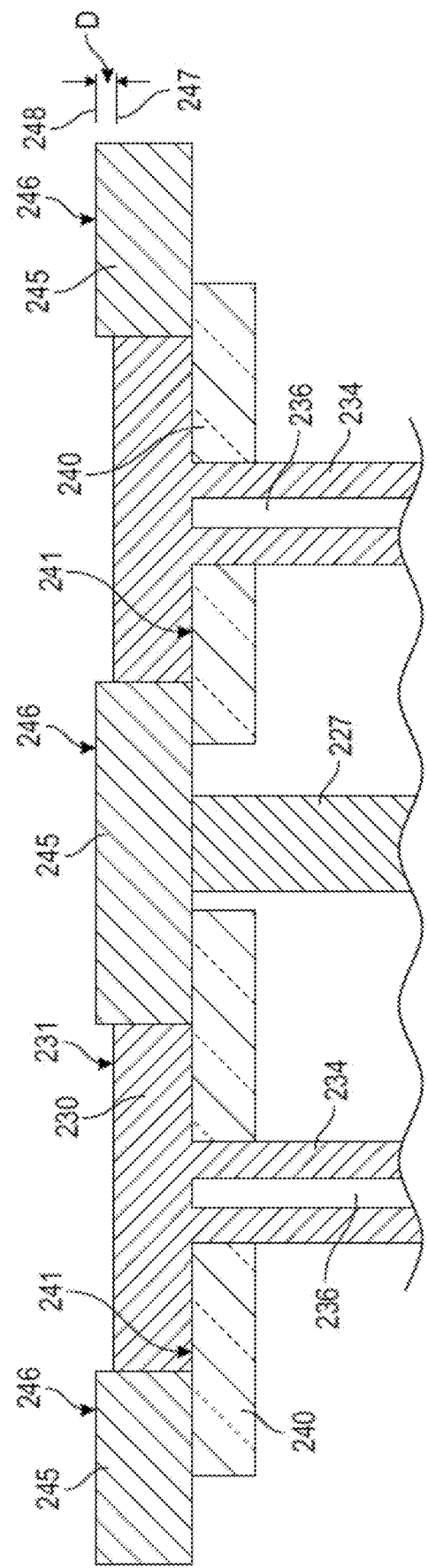
FIG. 9 is a partial cross-sectional side view of a support assembly in accordance with one or more embodiment of the disclosure.

Referring to FIG. 9, in some embodiments, the support plate 245 has a top surface 246 forming a major plane 248 that is substantially parallel with a major plane 247 formed by the support surface 231 of the heater 230. In some embodiments, the support plate 245 has a top surface 246 forming a major plane 248 that is a distance D above the major plane 247 of the support surface 231. In some embodiments, the distance D is substantially equal to the thickness of a substrate 260 to be processed so that the substrate 260 surface 261 is coplanar with the top surface 246 of the support plate 245, as shown in FIG. 6. As used in this manner, the term "substantially coplanar" means that the major plane formed by the surface 261 of the substrate 260 is within ±1 mm, ±0.5 mm, ±0.4 mm, ±0.3 mm, ±0.2 mm or ±0.1 mm of coplanarity.

Referring to FIG. 9, some embodiments of the disclosure have separate components making up the support surfaces for processing. Here, the sealing platform 240 is a separate component than the heater 230 and is positioned so that the top surface 241 of the sealing platform 240 is below the support surface 231 of the heater 230. The distance between the top surface 241 of the sealing platform 240 and the support surface 231 of the heater 230 is sufficient to allow support plate 245 to be positioned on the sealing platforms 240. The thickness of the support plate 245 and/or position of the sealing platform 240 can be controlled so that the distance D between the top surface 246 of the support plate 245 is sufficient so that the top surface 261 of a substrate 260 (see FIG. 6) is substantially coplanar with the top surface 246 of the support plate 245.

Figure 10:
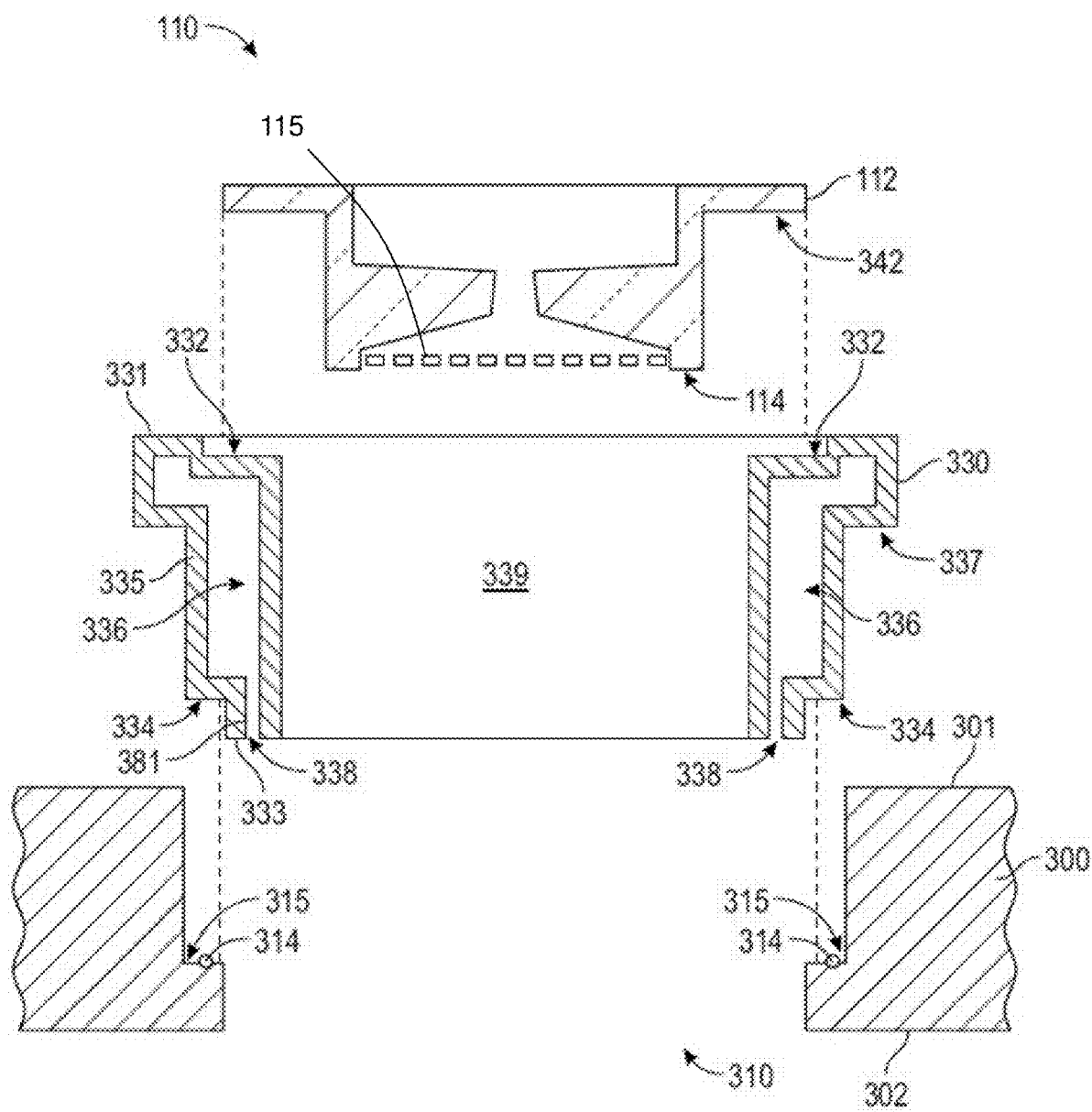
FIG. 10 is an exploded cross-sectional view of a process station in accordance with one or more embodiment of the disclosure.

FIG. 10 illustrates an exploded view of a processing station 110 in accordance with one or more embodiment of the disclosure. The processing station 110 illustrated comprises three main components: the top plate 300 (also called a lid), a pump/purge insert 330 and a gas injector 112. The gas injector 112 shown in FIG. 10 is a showerhead type gas injector having a plurality of small gas holes 115. In some embodiments, the insert is connected to or in fluid communication with a vacuum (exhaust). In some embodiments, the insert is connected to or in fluid communication with a purge gas source.

The openings 310 in the top plate 300 can be uniformly sized or have different sizes. Different sized/shape gas injectors 112 can be used with a pump/purge insert 330 that is suitably shaped to transition from the opening 310 to the gas injector 112. For example, as illustrated, the pump/purge insert 330 includes a top 331 and bottom 333 with a sidewall 335. When inserted into the opening 310 in the top plate 300, a ledge 334 adjacent the bottom 333 can be positioned on the shelf 315 formed in the opening 310. In some embodiments, there is no shelf 315 in the opening and a flange portion 337 of the pump/purge insert 330 rests on top of the top plate 300. In the illustrated embodiment, the ledge 334 rests on shelf 315 with an o-ring 314 positioned between to help form a gas-tight seal.

In some embodiments, there are one or more purge rings in the top plate. The purge rings can be in fluid communication with a purge gas plenum (not shown) or a purge gas source (not shown) to provide a positive flow of purge gas to prevent leakage of processing gases from the processing chamber.

The pump/purge insert 330 of some embodiments includes a gas plenum 336 with at least one opening 338 in the bottom 333 of the pump/purge insert 330. The gas plenum 336 has an inlet (not shown), typically near the top 331 or sidewall 335 of the pump/purge insert 330.

In some embodiments, the plenum 336 can be charged with a purge or inert gas which can pass through the opening 338 in the bottom 333 of the pump/purge insert 330. The gas flow through the opening 338 can help create a gas curtain type barrier to prevent leakage of process gases from the interior of the processing chamber.

In some embodiments, the plenum 336 is connected to or in fluid communication with a vacuum source. In such an embodiment, gases flow through the opening 338 in the bottom 333 of the pump/purge insert 330 into the plenum 336. The gases can be evacuated from the plenum to exhaust. Such arrange can be used to evacuate gases from the process station 110 during use.

The pump/purge insert 330 includes an opening 339 in which a gas injector 112 can be inserted. The gas injector 112 illustrated has a flange 342 which can be in contact with the ledge 332 adjacent the top 331 of the pump/purge insert 330. The diameter or width of the gas injector 112 can be any suitable size that can fit within the opening 339 of the pump/purge insert 330. This allows gas injectors 112 of various types to be used within the same opening 310 in the top plate 300.

In some embodiments, as illustrated in FIG. 2, the support assembly 200 includes at least one motor 250. The at least one motor 250 is connected to the center base 210 and is configured to rotate the support assembly 200 around the rotational axis 211. In some embodiments, the at least one motor is configured to move the center base 210 in a direction along the rotational axis 211. For example, in FIG. 2, motor 255 is connected to motor 250 and can move the support assembly 200 along the rotational axis 211. Stated differently, the motor 255 illustrated can move the support assembly 200 along the z-axis, vertically or orthogonally to the movement caused by motor 250. In some embodiments, as illustrated, there is a first motor 250 to rotate the support assembly 200 around the rotational axis 211 and a second motor 255 to move the support assembly 200 along the rotational axis 211 (i.e., along the z-axis or vertically).

Figure 11:
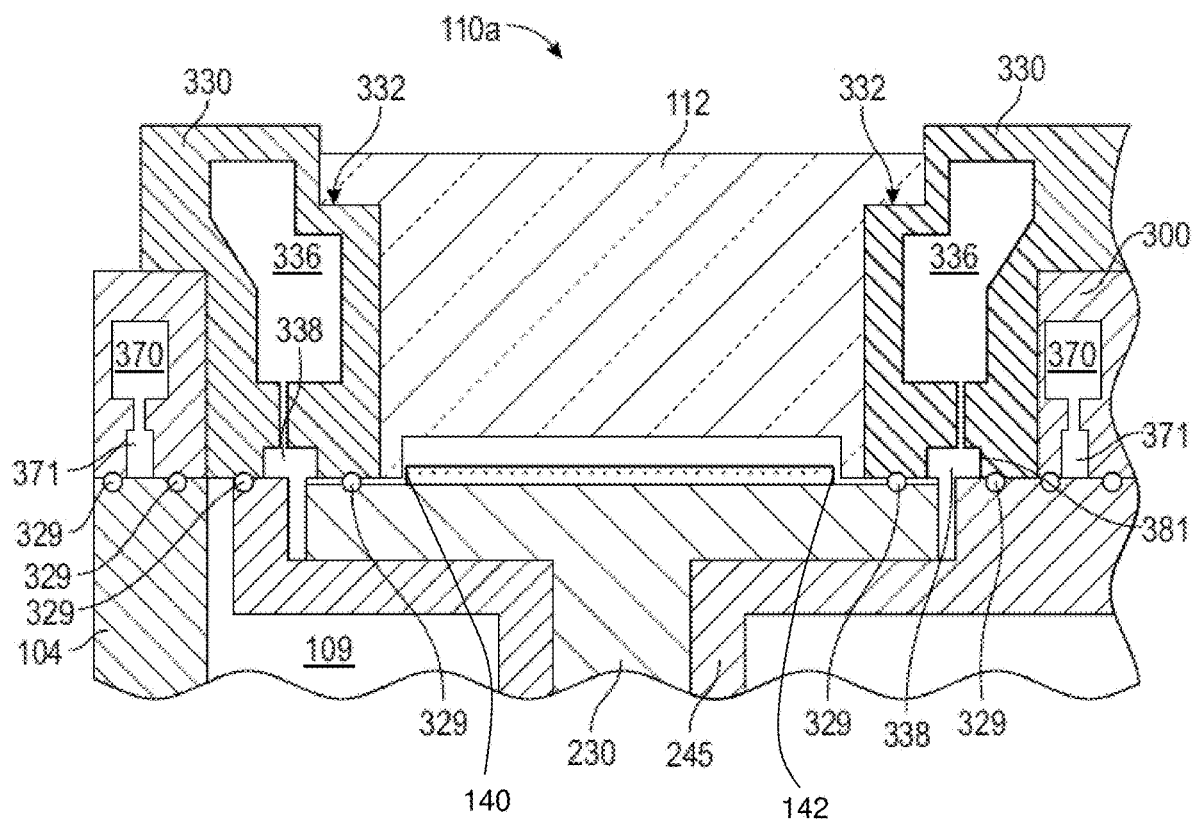
FIG. 11 is a partial cross-sectional side view of a process station in a processing chamber in accordance with one or more embodiment of the disclosure.

Referring to FIGS. 2 and 11, one or more vacuum streams and/or purge gas streams can be used to help isolate one process station 110a from an adjacent process station 110b. A purge gas plenum 370 can be in fluid communication with a purge gas port 371 at the outer boundary of the process stations 110. In the embodiment illustrated in FIG. 11, the purge gas plenum 370 and purge gas port 371 are located in the top plate 300. Plenum 336, shown as part of the pump/purge insert 330, is in fluid communication with opening 338 which acts as a pump/purge gas port. In some embodiments, the purge gas port 371 and purge gas plenum 370 and the vacuum port (opening 338) can extend around the perimeter of the process station 110 to form a gas curtain. The gas curtain can help minimize or eliminate leakage of process gases into the interior volume 109 of the processing chamber.

In the embodiment illustrated in FIG. 11, differential pumping can be used to help isolate the process station 110. The pump/purge insert 330 is shown in contact with the heater 230 and support plate 245 with o-rings 329. The o-rings 329 are positioned on either side of the opening 338 in fluid communication with the plenum 336. One o-ring 329 is positioned within the circumference of the opening 338 and the other o-ring 329 is position outside the circumference of the opening 338. The combination of o-rings 329 and pump/purge plenum 336 with opening 338 can provide sufficient differential pressure to maintain gas-tight sealing of the process station 110 from the interior volume 109 of the processing chamber 100. In some embodiments, there is one o-ring 329 positioned either inside or outside of the circumference of the opening 338. In some embodiments, there are two o-rings 329 positioned—one inside and one outside of—the circumference of the purge gas port 371 in fluid communication with plenum 370. In some embodiments, there is one o-ring 329 positioned either inside or outside of the circumference of purge gas port 371 in fluid communication with plenum 370.

The boundary of a process station 110 can be considered the region within which a process gas is isolated by the pump/purge insert 330. In some embodiments, the outer boundary of the process station 110 is the outermost edge 381 of the opening 338 in fluid communication with the plenum 336 of the pump/purge insert 330, as shown in FIG. 14.

The number of process stations 110 can vary with the number of heaters 230 and support arms 220. In some embodiments, there are an equal number of heaters 230, support arms 220 and process stations 110. In some embodiments, the heaters 230, support arms 220 and process stations 110 are configured to that each of the support surfaces 231 of the heaters 230 can be located adjacent the front faces 214 of different process stations 110 at the same time. Stated differently, each of the heaters is positioned in a process station at the same time.

The spacing of the processing stations 110 around the processing chamber 100 can be varied. In some embodiments, the processing stations 110 are close enough together to minimize space between the stations so that a substrate can be moved rapidly between the process stations 110 while spending a minimum amount of time and transfer distance outside of one of the stations. In some embodiments, the process stations 110 are positioned close enough that a substrate being transported on the support surface 231 of a heater 230 is always within one of the process stations 110.

Figure 12A:
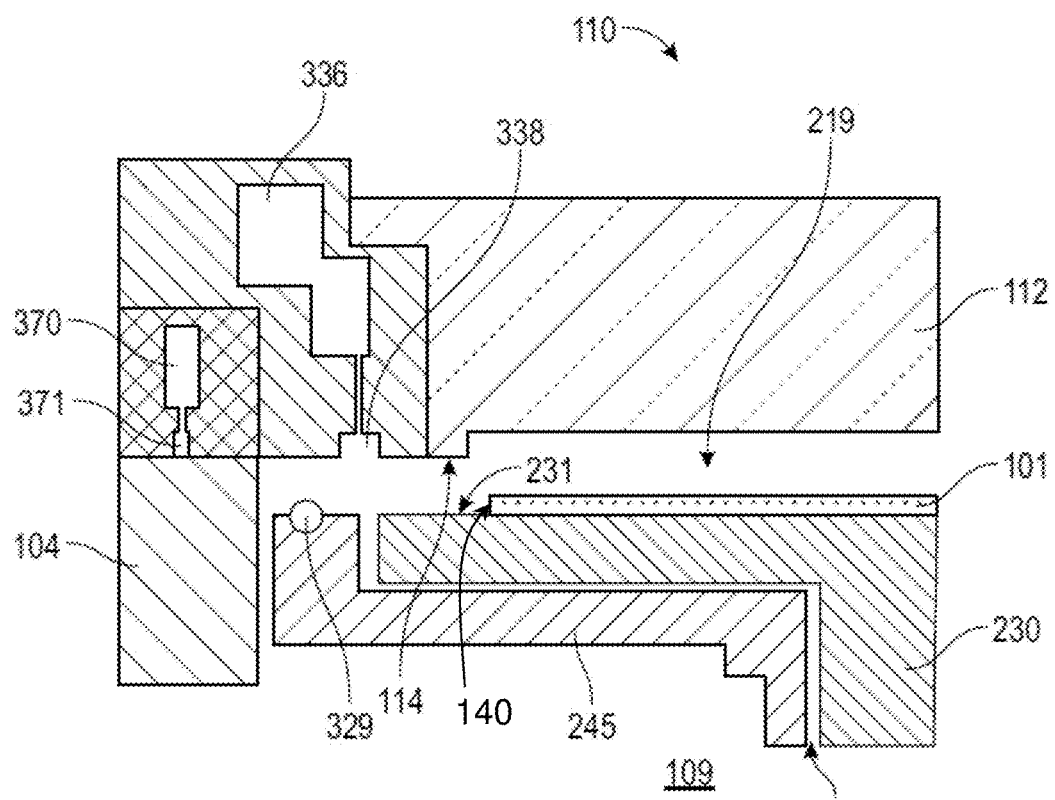
FIGS. 12A and 12B show schematic representations of a process in accordance with one or more embodiment of the disclosure.
Figure 12B:
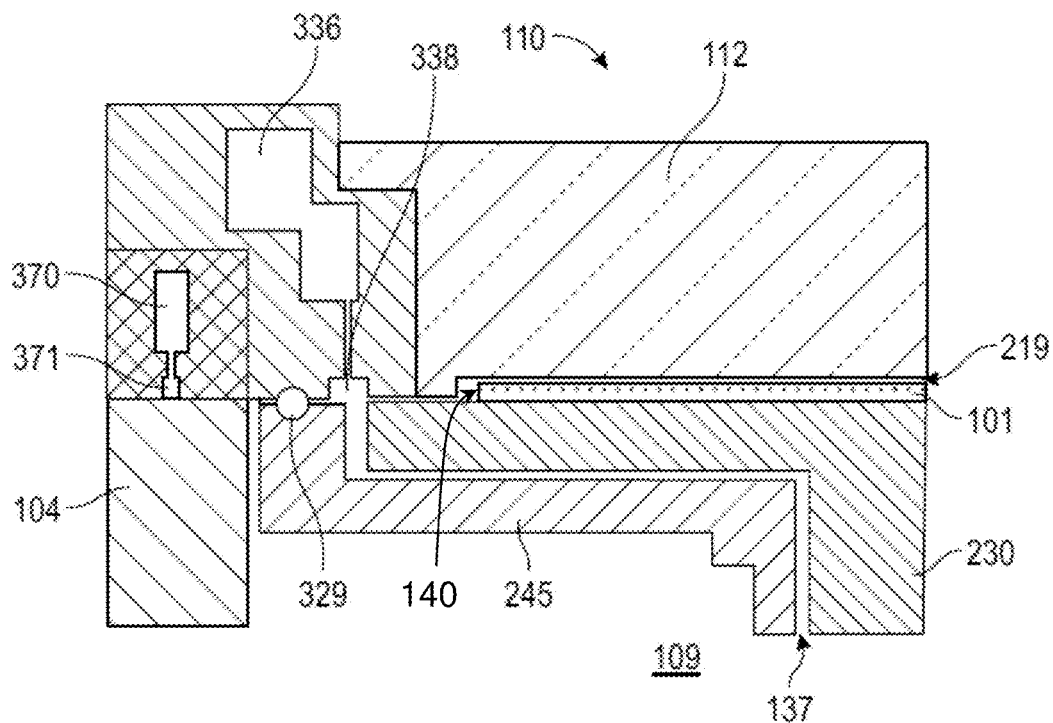

FIGS. 12A and 12B illustrate another embodiment of the disclosure. FIG. 12A shows a partial view of a heater 230 and support plate 245 which has been rotated to a position beneath process station 110 so that wafer 101 is adjacent the gas injector 112. An O-ring 329 on the support plate 245, or on an outer portion of the heater 230, is in a relaxed state.

FIG. 12B shows the support plate 245 and heater 230 after being moved toward the process station 110 so that the support surface 231 of the heater 230 is in contact with or nearly contacts the front face 114 of the gas injector 112 in the process station 110. In this position, O-ring 329 is compressed forming a seal around the outer edge of the support plate 245 or outer portion of the heater 230. This allows the wafer 101 to be moved as close the gas injector 112 as possible to minimize the volume of the reaction region 219 so that the reaction region 219 can be rapidly purged.

Gases which might flow out of the reaction region 219 are evacuated through opening 338 into plenum 336 and to an exhaust or foreline (not shown). A purge gas curtain outside of the opening 338 can be generated by purge gas plenum 370 and purge gas port 371. Additionally, a gap 137 between the heater 230 and the support plate 245 can help to further curtain off the reaction region 219 and prevent reactive gases from flowing into the interior volume 109 of the processing chamber 100.

Figure 13:
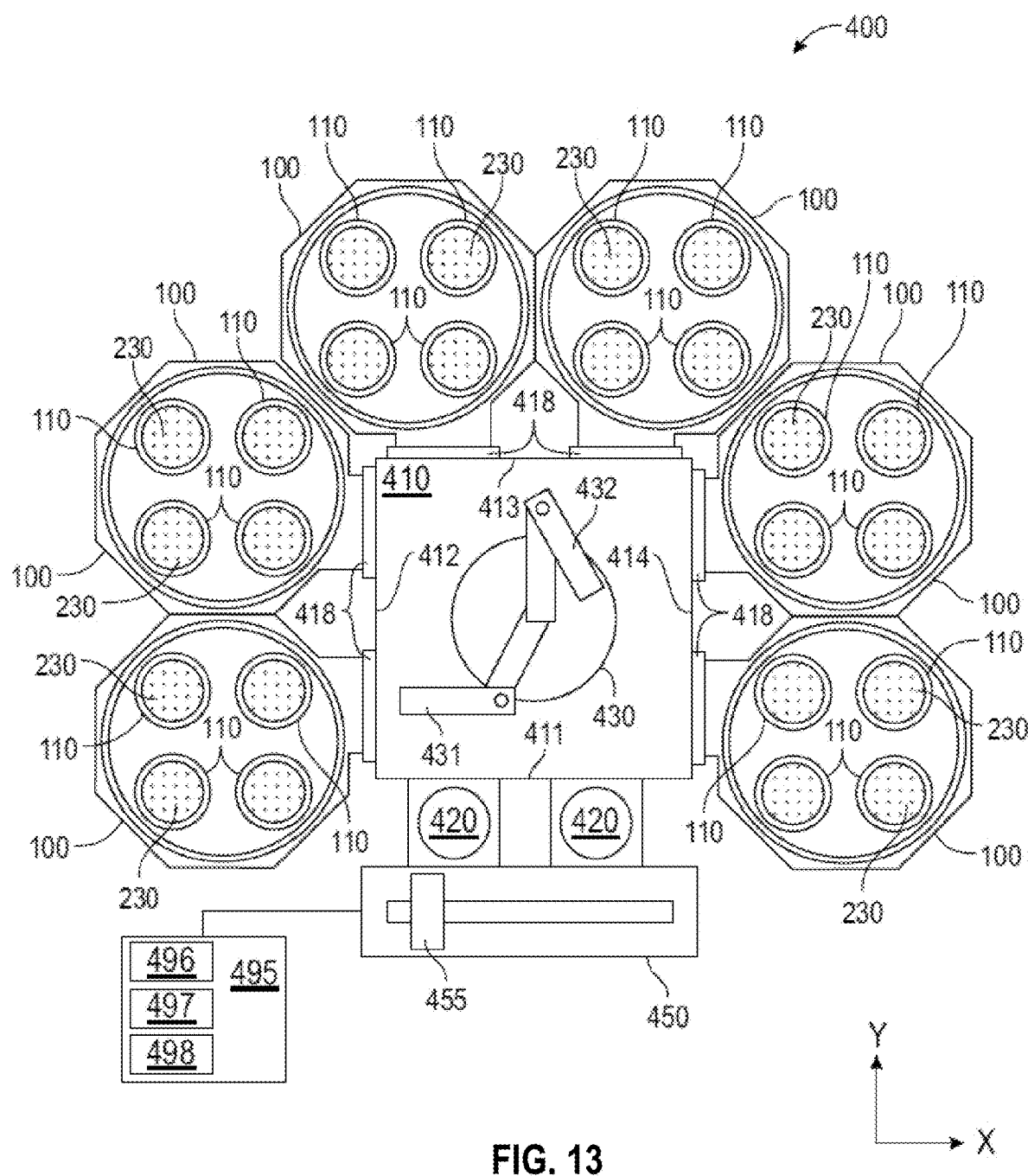
FIG. 13 is a schematic representation of a processing platform in accordance with one or more embodiment of the disclosure.

FIG. 13 shows a processing platform 400 in accordance with one or more embodiment of the disclosure. The embodiment shown in FIG. 13 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 may include separate controllers for each of the individual processing chambers 100, central transfer station 410, factory interface 450 and robots 430.

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Figure 14A:
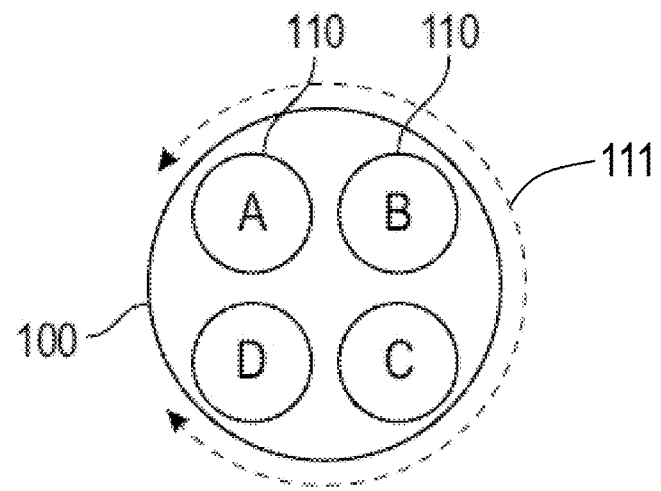
FIGS. 14A and 14B shows schematic views of process station configurations in a processing chamber in accordance with one or more embodiment of the disclosure.
Figure 14B:
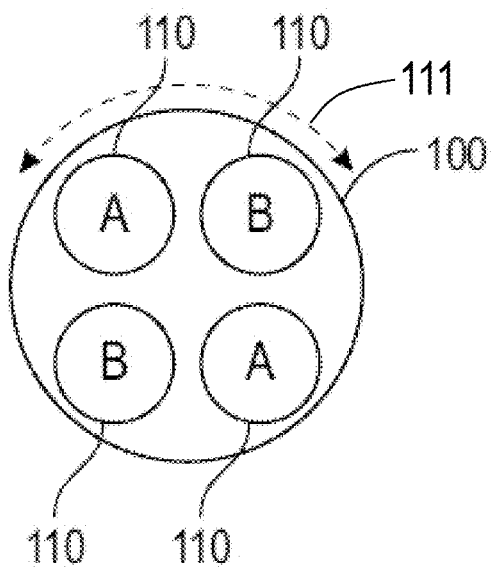

FIGS. 14A and 14B illustrate various configurations of processing chambers 100 with different process stations 110. The lettered circles represent the different process stations 110 and process conditions. For example, in FIG. 14A, there are four process stations 110 each with a different letter. This represents four process stations 110 with each station having different conditions than the other stations. As indicated by the arrow 111, a process could occur by moving the heaters with substrates from stations A through D. After exposure to D, the cycle can continue or reverse.

In FIG. 14B, two or four substrates can be processed at the same time with the substrates being moved on the heaters back and forth between the A and B positions. Two substrates could start in the A positions and two substrates in the B positions. The independent process stations 110 allow for the two of the stations to be turned off during the first cycle so that each substrate starts with an A exposure. The heaters and substrates can be rotated continuously either clockwise or counter-clockwise. In some embodiments, the heaters and substrates are rotated 90° in a first direction (e.g., A to B) and then 90° in a second direction (e.g., B back to A). This rotation can be repeated to result in four substrates/heaters being processed without rotating the support assembly by more than about 90°.

The embodiment illustrated in FIG. 14B might also be useful in processing two substrates in the four process stations 110. This might be particularly useful if one of the processes is at a very different pressure or the A and B process times are very different. The skilled artisan will recognize that the embodiments illustrated in FIGS. 14A and 14B are merely representative of two possible configurations and other configurations are within the scope of the disclosure.

Deposition non-uniformity resulting from a station can be improved by either: not coming to a full stop inside of the station or coming to a full stop but having the position within that station differ from cycle to cycle.

In some embodiments, a substrate is processed without being brought to a complete stop within a process station. Once the wafer is inside the process station, the substrate support continues to move the duration of the time in that station. Movement during processing in a process station in some embodiments is slow so that the substrate travels from end to end of the process region, or over a predetermined portion of the available space, within the station. In some embodiments, the substrate is moved back and forth multiple times within the process station. In some embodiments, movement of the substrate is characterized by an angular offset of the substrate in a range of process positions within ±3.25° of the central axis of the support assembly, or the process station. In some embodiments, the range of offset positions is measured with the substrate centered under the gas injector of a process station. In some embodiments, the angular offset is characterized by a range of process positions within ±5°, ±4.5°, ±4° or ±3.5° of the central axis of the support assembly, or the process station. The movement of the substrate can occur within the process gap between the front face of the gas injector and the top surface of the substrate. Thus, a leading edge 140 of the substrate and a trailing edge 142 (see FIG. 11) of the substrate is also angularly offset in relation to the processing station 110a.

In some embodiments, the substrate is brought to a complete stop within a process station for processing. Each time the substrate returns to that same process station, the location of the substrate within the station is different (angularly offset relative to the first position or the center of the station) so that there are at least two different positions during deposition. The location within the station can be random or varied by one or more known amounts.

In some embodiments, the controller has one or more configurations to rotate the substrate support assembly. In some embodiments, the controller is configured to oscillate the support assembly during processing in the process stations. The controller of some embodiments oscillates the support assembly along an arc with a radius equal to the distance from the central axis of the support assembly to the center of the support surfaces. In some embodiments, the substrate is positioned off-center of the support surfaces during processing. In embodiments of this sort, the radius of the arc is equal to the distance from the central axis of the support assembly to the center of the substrate, or center of the substrate support region of the support surface.

Figure 15A:
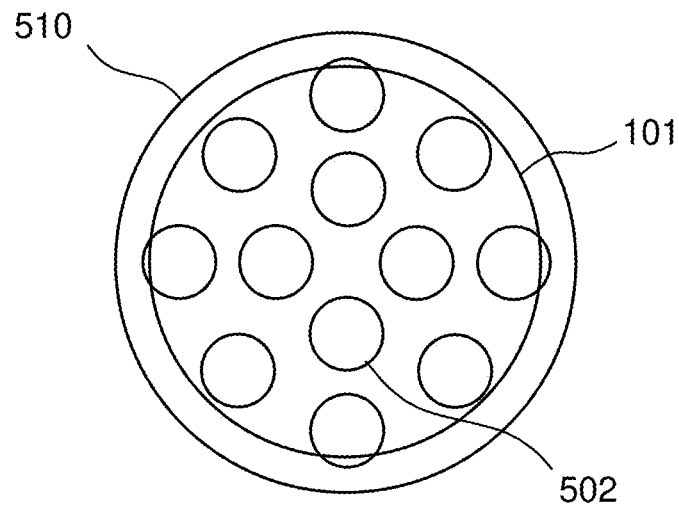
FIGS. 15A and 15B shows schematic views of process station configurations in a processing chamber in accordance with one or more embodiment of the disclosure.
Figure 15B:
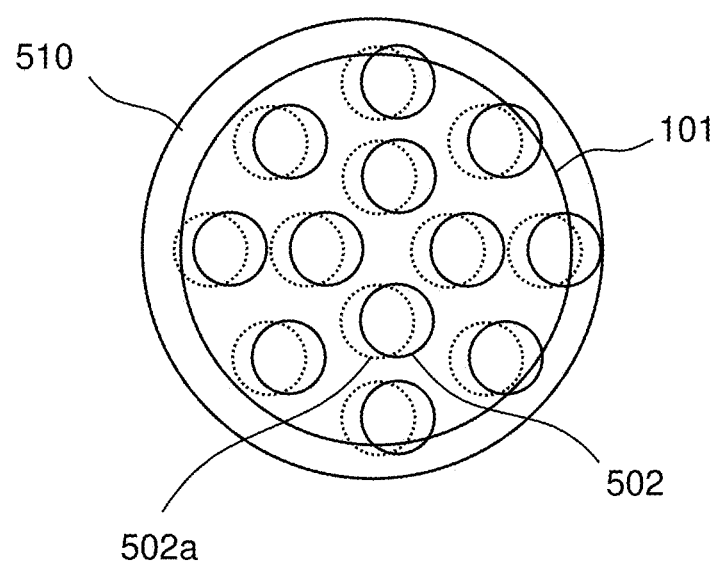

FIG. 15A shows a representation of a substrate 101 within a first process station 510 of one or more embodiments. Deposition regions 502 are used to show relative location of the substrate within the station relative to the gas injector. In FIG. 15A, the substrate 101 is centered within the process station 510. After a first cycle, the substrate 101 develops a plurality of deposition regions 502 on the surface of the substrate, each of the plurality of deposition regions 502 being directly below one of the small gas holes 115 of the gas injectors 112 (see FIG. 10). The skilled artisan will recognize that deposition occurs across the entire substrate and that the deposition regions 502 are exaggerated for descriptive purposes to show regions which may have thicker deposition due to different precursor exposure doses. In some embodiments, where layers have already been deposited on a substrate in a prior cycle, the deposited layer develops a plurality of deposition regions 502 on the surface of the layer of the substrate. FIG. 15B shows a second cycle in the first process station 510 in which the substrate 101 is angularly offset from the position in FIG. 15A. The deposition regions 502a are similarly angularly offset relative to the deposition regions 502 from the first cycle.

While gas flows throughout the reaction region 219 of FIGS. 12A and 12B, due to the turbulence and gas kinetics within the chamber, regions of non-uniform deposition on the substrate occur, forming what is referred to as the plurality of deposition regions 502. A deposited layer of the first cycle may thus have non-uniform deposition of varying thickness on an atomic level, resulting in non-uniformity, plasma damage and/or processing flexibility issues.

FIG. 15B shows a representation of the substrate at a second position within the first processing station 510 during a second cycle. As shown in FIG. 15B, offsetting the rotatable structure by a predetermined value also offsets the substrate in relation to the one of the gas injectors 112. While gas flows throughout the reaction region 219 during the second cycle, regions of non-uniform deposition on the substrate occur within and around an offset plurality of deposition regions 502a, thereby reducing the overall non-uniformity. In some embodiments, the offset occurs within the first processing station 510.

Figure 16A:
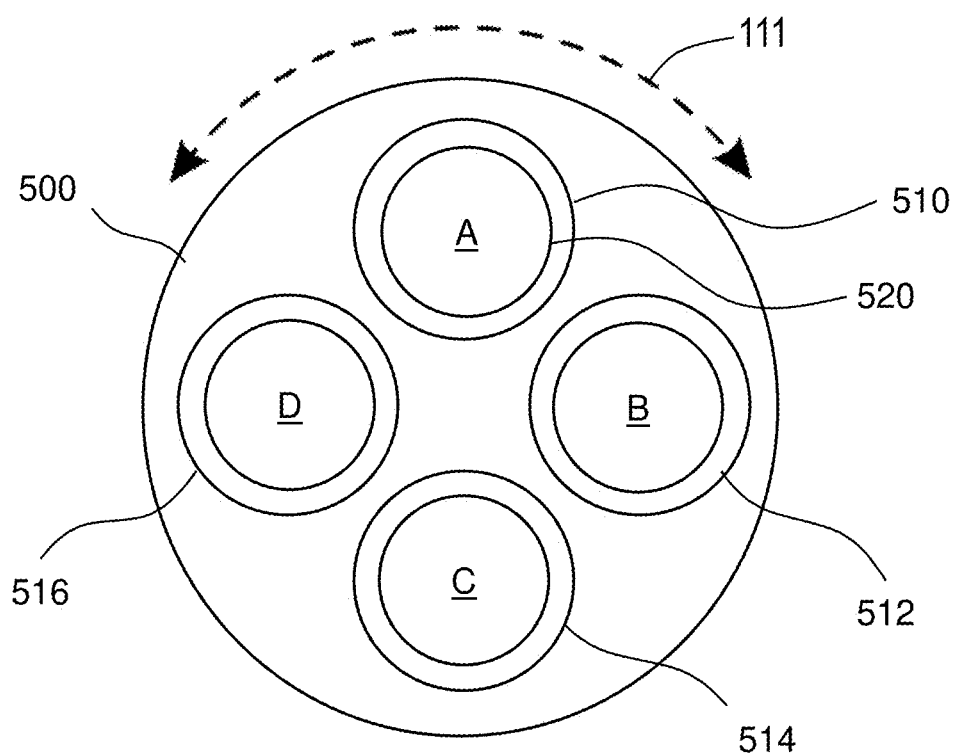
FIGS. 16A and 16B shows schematic views of process station configurations in a processing chamber in accordance with one or more embodiment of the disclosure.
Figure 16B:
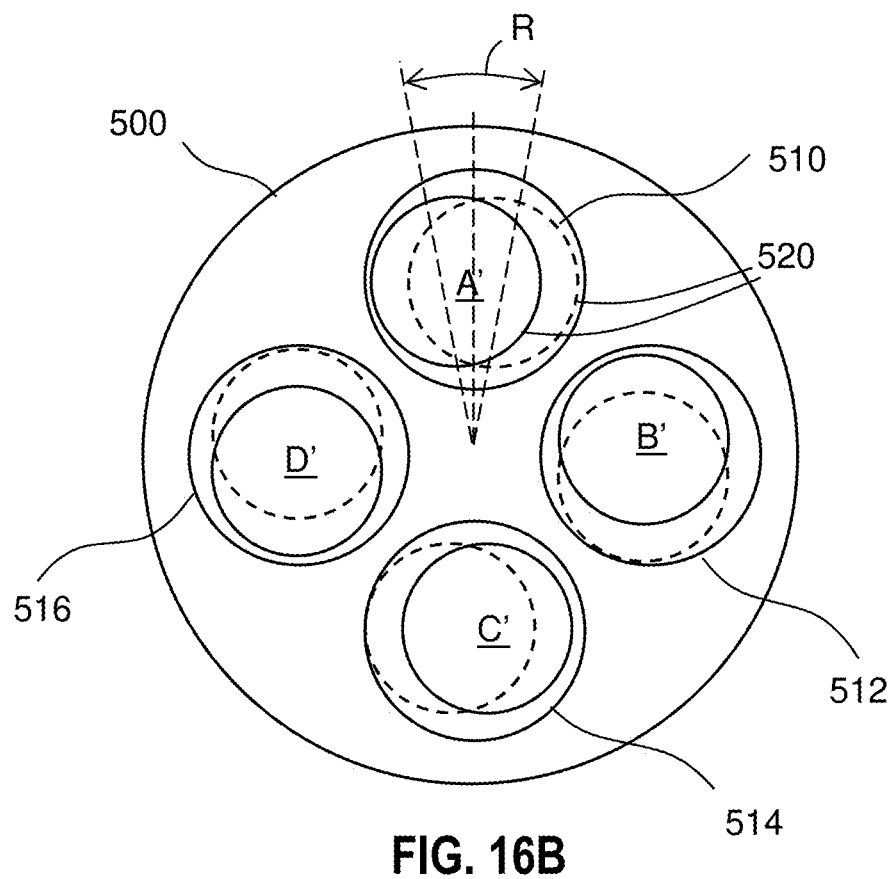

As shown in FIGS. 16A and 16B, in some embodiments, each of the processing stations (510, 512, 514, 516) have a range R of process positions. The range R of process positions for each of the processing stations (510, 512, 514, 516) is limited by the leading edge 140 and trailing edge 142 (see FIG. 11) of the substrate. Both the leading edge 140 and trailing edge 142 of the substrate remain fully under the small gas holes 115 of the gas injectors 112 while within the range of process positions. In some embodiments, the range R of process positions extends from a point where the leading edge 140 of the substrate is within the reaction region 219 (see FIG. 12B) to a point where the trailing edge 142 of the substrate remains within the reaction region 219. The range R of process positions can be affected by the shape of the front face 114 of the gas injectors 112.

In some embodiments, the gas injectors 112 (see FIG. 10) are not limiting to the boundaries of the process positions. For example, in an embodiment in which the pump/purge insert 330 (see FIG. 10) is closer to the substrate support than the front face 114 of the gas injector 112, the edges of the process positions range is defined by the pump/purge insert 330.

The range R of process positions are angularly offset along an arc within the range of process positions, the arc having a radius defined by a distance from a central axis of the support assembly 200 to a central axis of the support surface 231, the support surface rotatable around the central axis 211 of the support assembly 200 (see FIG. 3-4), each of the ranges defined by a first end and a second end. In some embodiments, the first end is the trailing edge 142 and the second end is the leading edge 140. In some embodiments, the first end is the leading edge 140 and the second end is the trailing edge 142 (see FIG. 11).

Movement of the support surface comprises rotating the support surface around a central axis of the support assembly 200, the support surface having a center axis spaced a distance from the central axis of the support assembly. In some embodiments, each movement to one of the processing stations (510, 512, 514, 516) has a random process position. Further movements to one of the processing stations (510, 512, 514, 516) places the support surface at a center of the range, first end or second end of the range or at a position between the first and second end.

In operation, each substrate can be under an independent environment until the process is finished, then the rotatable structure can rotate to move the substrates on the support surfaces to the next environment. In some embodiments where an offset is employed, instead of rotating 90° (for four station process chamber), the support surfaces are rotated in the range of 86.75° to 93.25°. Where an offset is employed in a three process station chamber, the expected 120° rotation for three stations is instead rotated by 116.75° to 123.25°.

FIGS. 16A and 16B illustrate various configurations of processing chambers 500 with process stations arranged concentrically around each of the processing chambers 500. Each of the processing chambers 500 comprises a first process station 510, a second process station 512, a third process station 514 and a fourth process station 516. As indicated by the arrow of FIG. 16A, a process occurs by moving the support surfaces with substrates from the first processing station 510 through the fourth processing station 516 in either direction. After exposure to the fourth processing station 516, the cycles can continue in the same direction or reverse. Each of the support surfaces with substrates rotate by 90° through each step of the cycle.

A processing method for "dithering" or dynamic offsetting for improved uniformity is described. The processing method comprises moving a support surface 520 from a first process position A of FIG. 16A within the first processing station 510 to a first process position B of FIG. 16A within a second processing station 512, and subsequently moving the support surface 520 to a second process position A' of FIG. 16B within the first processing station 510, the second process position A' of FIG. 16B within the first processing station 510 being different from the first process position A of FIG. 16A within the first processing station 510.

The method further comprises moving the support surface 520 to a second process position B' of FIG. 16B within the second processing station 512, the second process position B' within the second processing 512 station different from the first process B of FIG. 16A position within the second processing station 512. The support surface 520 may then be moved to a first process position C of FIG. 16A within a third processing station 514 and subsequently to a first process position D of FIG. 16A within a fourth processing station 516. The support surface 520 may then further be moved to a second process position C' of FIG. 16B within the third processing station 514, the second process position C' of FIG. 16B within the third processing station 514 being different from the first processing position C of FIG. 16A within the third processing station 514. The support surface 520 may then be moved to a second process position D' of FIG. 16A within the fourth processing station 516, the second process position D' of FIG. 16B within the fourth processing station 516 being different from the first processing position D of FIG. 16A within the fourth processing station 516.

Referring back to FIG. 13, the controller 495 of some embodiments has one or more configurations selected from: a configuration to move a substrate on the robot between the plurality of processing chambers; a configuration to load and/or unload substrates from the system; a configuration to open/close slit valves; a configuration to provide power to one or more of the heaters; a configuration to measure the temperature of the heaters; a configuration to measure the temperature of the substrates on the heaters; a configuration to load or unload substrates from the heaters; a configuration to provide feedback between temperature measurement and heater power control; a configuration to rotate the support assembly around the rotational axis; a configuration to move the support assembly along the rotational axis (i.e., along the z-axis); a configuration to set or change the rotation speed of the support assembly; a configuration to provide a flow of gas to a gas injector; a configuration to provide power to one or more electrodes to generate a plasma in a gas injector; a configuration to control a power supply for a plasma source; a configuration to control the frequency and/or power of the plasma source power supply; and/or a configuration to provide control for a thermal anneal treatment station. In some embodiments, the controller 549 has a configuration where the first process station performs an atomic layer deposition cycle and the second process station performs a capacitively coupled plasma cycle. In some embodiments, the controller 495 has one or more dithering configurations selected from: a configuration to move the center of the support surface from a first process position of a first processing station to a first process position of a second processing station, and to an angular offset position; a configuration to angularly rotate the support assembly within ±5° of the central axis of the support assembly; a configuration to rotate the support assembly within ±3.25° of the central axis of the support assembly.

In some embodiments, the controller further comprises a configuration to process the substrates under continuous motion within the station; a configuration to process the substrates under continuous motion in one continuous slow motion; a configuration to process the substrates under a forward and reverse motion within a process station; a configuration to process the substrates under a fixed position wherein the position varies from a cycle to a second cycle.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A support assembly comprising:
   a support surface positioned a distance from a central axis of the support assembly, the support surface rotatable around the central axis; and,
   a controller configured to move a center of the support surface from a first process position of a first processing station to a first process position of a second processing station, and to a second process position within the first processing station having an angular offset from the first process position in the first processing station.

2. The support assembly of claim 1, wherein the controller is further configured to move the support surface to the second processing station and back to the first processing station in a second angular offset position defining a third processing position of a first processing station.

3. The support assembly of claim 1, wherein the angular offset position is located within a range of process positions.

4. The support assembly of claim 3, wherein the angular offset position is located along an arc within the range of process positions, the arc having a radius defined by the distance from the central axis of the support assembly to a center of the support surface.

5. The support assembly of claim 4, wherein the arc within the range of process positions extends within ±3.25° from a first process position.

6. A processing chamber comprising:
   a housing having walls, a bottom and a top defining an interior volume;
   a support assembly comprising a plurality of support surfaces positioned a distance from a central axis of the support assembly, the support surfaces rotatable around the central axis;
   a plurality of process stations in the interior volume of the housing, the process stations positioned in a circular arrangement around the central axis, each process station comprising a gas injector having a front face;
   a motor connected to the support assembly configured to rotate the support assembly around the central axis; and
   a controller configured to move a center of the support surface from a first process position of a first processing station to a first process position of a second processing station, and to a second process position within the first processing station having an angular offset from the first process position in the first processing station.

7. The processing chamber of claim 6, wherein the controller is further configured to angularly rotate the support assembly within ±5° around the central axis of the support assembly relative to a center of the process station.

8. The processing chamber of claim 7, wherein the controller is further configured to angularly rotate the support assembly within ±3.25° of the central axis of the support assembly.

9. The processing chamber of claim 6, wherein the controller is configured to oscillate the support assembly along an arc with a radius defined from the central axis of the support assembly to the center of the support surfaces and during processing in the plurality of process stations.

10. The processing chamber of claim 6, wherein the controller is further configured to bring the substrate support to a complete stop within a process station for processing.

11. The processing chamber of claim 6, wherein the controller is configured so that each stop within the same process station is at a different angular offset than the angular offset of the most recent stop in that process station.

12. The processing chamber of claim 6, wherein each process station has a range of process positions within a reaction region, the range of process positions extending from a point where a leading edge and trailing edge of a substrate on the substrate support is within a reaction region of the process station.

* * * * *